United States Patent
Chiu

(10) Patent No.: US 7,327,028 B2
(45) Date of Patent: Feb. 5, 2008

(54) EMBEDDED HEAT SPREADER FOR FOLDED STACKED CHIP-SCALE PACKAGE

(75) Inventor: Chia-Pin Chiu, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 46 days.

(21) Appl. No.: 10/788,071

(22) Filed: Feb. 24, 2004

(65) Prior Publication Data

US 2005/0184370 A1 Aug. 25, 2005

(51) Int. Cl.
*H01L 23/34* (2006.01)
(52) U.S. Cl. ............... 257/713; 257/E23.106; 257/706; 257/707; 257/712
(58) Field of Classification Search ........ 257/668, 257/718–720, 706, 688, 698, 724, 723, 678, 257/E23.102, E25.01, 707, 686, 777, E23.105, 257/E23.023, E23.106, 712, 713
See application file for complete search history.

(56) References Cited

U.S. PATENT DOCUMENTS

| | | | | |
|---|---|---|---|---|
| 4,743,868 A | * | 5/1988 | Katoh et al. ............ | 333/12 |
| 5,543,663 A | * | 8/1996 | Takubo .................. | 257/720 |
| 5,548,161 A | * | 8/1996 | Hirano et al. ........... | 257/722 |
| 5,742,477 A | * | 4/1998 | Baba .................... | 361/704 |
| 5,777,847 A | * | 7/1998 | Tokuno et al. ........... | 361/705 |
| 5,926,369 A | * | 7/1999 | Ingraham et al. ........ | 361/699 |
| 5,986,887 A | * | 11/1999 | Smith et al. ............ | 361/704 |
| 6,075,700 A | * | 6/2000 | Houghton et al. ........ | 361/704 |
| 6,208,521 B1 | * | 3/2001 | Nakatsuka .............. | 361/749 |
| 6,349,033 B1 | * | 2/2002 | Dubin et al. ........... | 361/704 |
| 6,469,375 B2 | * | 10/2002 | Beausoleil et al. ....... | 257/686 |
| 6,816,378 B1 | * | 11/2004 | Belady et al. .......... | 361/704 |
| 6,833,993 B2 | * | 12/2004 | Wang .................... | 361/704 |

* cited by examiner

*Primary Examiner*—Kenneth Parker
*Assistant Examiner*—Chris C. Chu
(74) *Attorney, Agent, or Firm*—Trop, Pruner & Hu, P.C.

(57) ABSTRACT

In some embodiments, a T-shaped heat spreader may be provided centrally within a folded stacked chip-scale package. The dice may be situated around the T-shaped heat spreader which may be made of high conductivity material. Heat may be dissipated through the T-shaped spreader 24 and downwardly through thermal vias into a printed circuit board.

10 Claims, 1 Drawing Sheet

EMBEDDED HEAT SPREADER FOR FOLDED STACKED CHIP-SCALE PACKAGE

BACKGROUND

This invention relates generally to packaging integrated circuits.

A folded stacked chip-scale package is a package that may include a number of semiconductor integrated circuits. The dice may be separated by an epoxy layer and may be coupled to a printed circuit board through solder balls, as one example.

Therefore, heat conduction from the stacked integrated circuits is essentially by way of the molded epoxy layer. While these packages have been effective, it would be desirable to increase the heat dissipation of these packages. This is particularly so in view of the amount of heat that may be built up within the package due to the presence of multiple integrated circuit dice.

DETAILED DESCRIPTION

Figure 1:
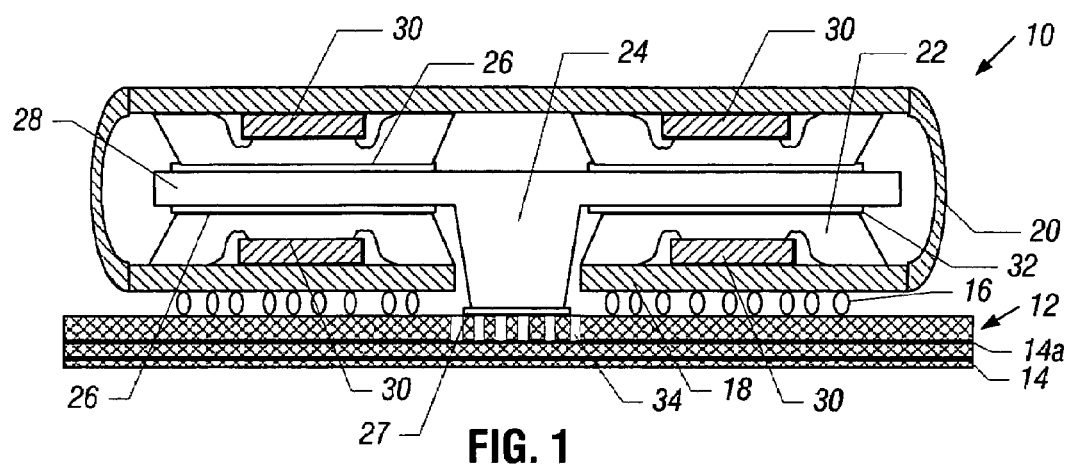
FIG. 1 is an enlarged, cross-sectional view through one embodiment of the present invention.

Referring to FIG. 1, a folded stacked chip-scale package 10 may include an outer cover 20. A plurality of semiconductor integrated circuit dice 30 may be maintained within the package 10. Each die 30 may be embedded in a molding compound 22, in one embodiment of the present invention. While four dice 30 are shown, other numbers of dice may be provided in other embodiments.

A T-shaped, central heat spreader 24 may conduct heat from the various dice 30 outwardly to a printed circuit board 12 on the exterior of the package 10. As a result, in some embodiments, the heat dissipation may be improved. The heat spreader 24 may be made of thermally conductive material, such as copper, aluminum, silver, copper tungsten, graphite composite, or diamond, to mention a few examples.

The package 10 may be electrically coupled to the printed circuit board 12 through solder balls 16, in one embodiment. The printed circuit board 12 may include power and ground planes 14, separated from one another and extending parallel to one another.

The heat spreader 28 may be thermally coupled to the molding compound 22 associated with each die 30 through a layer of epoxy 26. Similarly, the base 24 of the heat spreader 28 may be thermally coupled to the printed circuit board 12 through a layer 27 of epoxy or solder, for example. Heat conduction to the board 12 from the heat spreader 24 may be achieved through thermal vias 34. The thermal vias 34 may be formed in the printed circuit board 12 using conventional techniques. For example, highly thermally conductive material may be formed into drilled holes or ring-shaped trenches in the printed circuit board 12 to improve heat transfer. In one embodiment, the thermal vias 34 extend from the layer 27 down to a ground or power plane 14 within the printed circuit board 12. The ground or power plane 14a, for example, may then be useful in dissipating heat.

The outer cover 20 of the package 10 may be formed of a folded flexible tape in one embodiment of the present invention.

Figure 2:
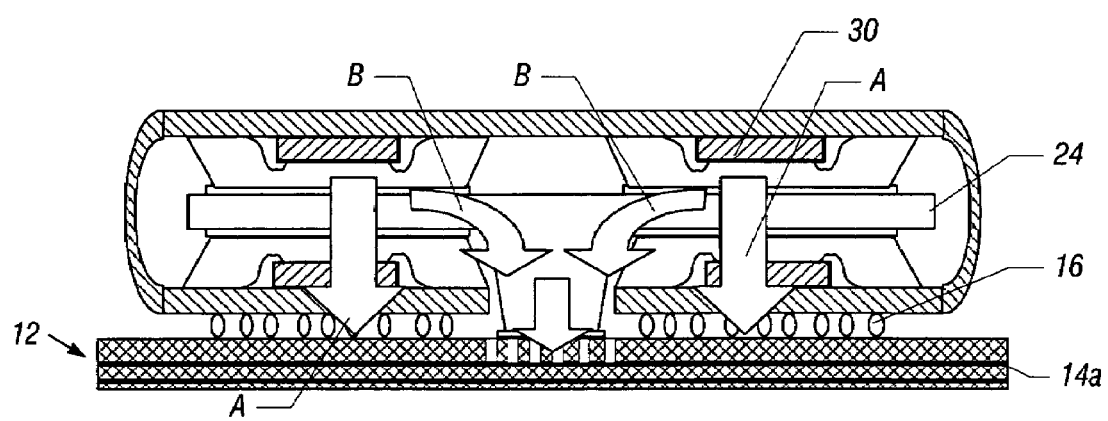
FIG. 2 shows the heat flow through the embodiment of FIG. 1 in accordance with one embodiment of the present invention.

Heat flow from the dice 30 outwardly of the package is indicated by the arrows A and B in FIG. 2. Heat may flow, for example, as indicated by the arrows A, from the dice 30, vertically through the package 10, and through the solder balls 16, down to the printed circuit board 12. Similarly, heat may flow through the heat spreader 24 downwardly through the thermal via 34 and ultimately into the upper plane 14a.

As a result, heat generated by multiple dice 30 can be dissipated through the heat spreader 24 and thermal vias 34 to the printed circuit board 12. The heat spreader 24 and vias 34 may lower the junction-to-board thermal resistance. In some embodiments, the presence of a relatively higher thermal conductivity (compared to epoxy) spreader 24 overcomes the junction-to-board thermal resistance caused by low thermal conductivity of the commonly used flex substrate and mold compounds. Some embodiments of the present invention can be used for memory modules that require multiple memory devices to be stacked in very limited space.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A printed circuit board comprising:
   a conductive plane formed in said printed circuit board;
   a thermal via extending to a surface of said printed circuit board from said conductive plane, said via including a series of adjacent, parallel plugs through said board; and
   a folded stacked chip-scale package coupled to said thermal via by an internal heat spreader, said thermal via to provide a conductive heat transfer path from said internal heat spreader through said package and said printed circuit board to said plane, said package including a folded tape cover and at least two stacked dice within said cover.

2. The board of claim 1 wherein said internal heat spreader is T-shaped.

3. The board of claim 2 including at least four dice, two of said dice over said T-shaped heat spreader and two of said device under said T-shaped heat spreader.

4. The board of claim 3 wherein said dice are coupled to said heat spreader by epoxy.

5. The board of claim 4 wherein the base of said T-shaped heat spreader is coupled to said thermal via by a thermal interface material.

6. The board of claim 1 wherein said T-shaped heat spreader is formed of metal.

7. A printed circuit board comprising:
   a conductive plane formed in said printed circuit board;
   a thermal via extending to a surface of said printed circuit board from said conductive plane, said via including a series of adjacent, parallel plugs through said board;
   a folded stacked chip-scale package coupled to said thermal via by a T-shaped internal heat spreader, said thermal via to provide a heat transfer path from said internal heat spreader through said package and said printed circuit board to said plane; and at least four dice, two of said dice over said T-shaped heat spreader and two of said dice under said T-shaped heat spreader.

8. The board of claim 7 wherein said T-shaped heat spreader is formed of metal.

9. The board of claim 7 wherein said dice are coupled to said heat spreader by epoxy.

10. The board of claim 9 wherein the base of said T-shaped heat spreader is coupled to said thermal via by a thermal interface material.

* * * * *